(12) United States Patent
Matsuki

(10) Patent No.: US 11,249,227 B2
(45) Date of Patent: Feb. 15, 2022

(54) WAVELENGTH CONVERTING ELEMENT, LIGHT SOURCE DEVICE, AND DISPLAY DEVICE

(71) Applicant: SEIKO EPSON CORPORATION, Tokyo (JP)

(72) Inventor: Hayato Matsuki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 15 days.

(21) Appl. No.: 16/942,557

(22) Filed: Jul. 29, 2020

(65) Prior Publication Data

US 2021/0033756 A1 Feb. 4, 2021

(30) Foreign Application Priority Data

Jul. 30, 2019 (JP) .............................. JP2019-139950

(51) Int. Cl.
*G02B 5/00* (2006.01)
*F21V 9/30* (2018.01)
*H01L 31/055* (2014.01)
*H01L 33/50* (2010.01)
*H01L 31/054* (2014.01)
(Continued)

(52) U.S. Cl.
CPC ................ *G02B 5/008* (2013.01); *F21V 9/30* (2018.02); *H01L 31/055* (2013.01); *H01L 31/0549* (2014.12); *H01L 33/508* (2013.01); *H01S 5/0087* (2021.01); *H01S 5/0609* (2013.01)

(58) Field of Classification Search
CPC ...... G02B 5/008; G02B 6/1226; G02B 5/201; G03B 21/204; B82Y 30/00; B82Y 15/00; H01L 33/508; H01L 33/504; H01L 33/502; H01L 31/02327; H01L 31/055;
(Continued)

(56) References Cited

U.S. PATENT DOCUMENTS

2013/0286633 A1* 10/2013 Rodriguez ........... C09K 11/883
362/84
2014/0146547 A1* 5/2014 Tsutsumi .................. F21V 9/08
362/343
(Continued)

FOREIGN PATENT DOCUMENTS

JP 2014-508379 A 4/2014
JP 2018-013688 A 1/2018

*Primary Examiner* — Thien T Mai
(74) *Attorney, Agent, or Firm* — Oliff PLC

(57) ABSTRACT

A wavelength converting element according to the present disclosure includes: a wavelength converting body including an incident surface and an exit surface and configured to perform wavelength conversion on a primary light in a first wavelength band, entered from the incident surface, thereby generating a secondary light in a second wavelength band, which differs from the first wavelength band, the wavelength converting body emitting the secondary light from the exit surface; a metallic antenna group provided in a close vicinity of the wavelength converting body and including a plurality of metallic antennas disposed so as to be spaced apart from each other at a distance of substantially an optical wavelength of the secondary light in the wavelength converting body; and a dielectric antenna group including a plurality of dielectric antennas and provided so as to face the exit surface of the wavelength converting body.

10 Claims, 9 Drawing Sheets

(51) Int. Cl.
*H01S 5/06* (2006.01)
*H01S 5/00* (2006.01)

(58) Field of Classification Search
CPC ... H01L 31/0549; H01S 5/005; H01S 5/0087; H01S 5/0609; F21V 9/30
See application file for complete search history.

(56) References Cited

U.S. PATENT DOCUMENTS

| | | | |
|---|---|---|---|
| 2015/0117015 A1* | 4/2015 | Roh | H01S 5/18391 362/293 |
| 2016/0161644 A1* | 6/2016 | Verschuuren | H01L 33/58 250/396 R |
| 2016/0190403 A1* | 6/2016 | Verschuuren | H01L 33/504 257/98 |
| 2018/0024279 A1 | 1/2018 | Murai et al. | |

\* cited by examiner

WAVELENGTH CONVERTING ELEMENT, LIGHT SOURCE DEVICE, AND DISPLAY DEVICE

The present application is based on, and claims priority from JP Application Serial Number 2019-139950, filed on Jul. 30, 2019, the disclosure of which is hereby incorporated by reference herein in its entirety.

BACKGROUND

1. Technical Field

The present disclosure relates to a wavelength converting element, a light source device, and a display device.

2. Related Art

A wavelength converting element is an optical element that converts inputted excitation light into light having a wavelength band different from that of the excitation light, and is used as a light source of a display device such as a projector. JP-A-2018-13688 described below discloses a wavelength converting device that includes a wavelength converting body including a phosphor plate, and also includes an antenna array including a plurality of metallic antennas formed on the wavelength converting body.

JP-A-2018-13688 describes that, when the metallic antenna is irradiated with light, the field strength near the metallic antenna increases due to localized surface plasmon resonance at the metallic antenna surface, which amplifies the wavelength converted light, and also causes the light to be outputted from the antenna array in a narrow angular distribution of light.

However, in a case of the configuration described in JP-A-2018-13688, both induction of plasmon resonance and control of light radiation angles are achieved only with a metallic antenna. This poses a problem in that these receive a constraint from each other, which results in a reduction in the degree of freedom in terms of wavelength selection and control of radiation angle.

SUMMARY

In order to solve the problem described above, a wavelength converting element according to one aspect of the present disclosure includes: a wavelength converting body including an incident surface and an exit surface and configured to perform wavelength conversion on a primary light in a first wavelength band, entered from the incident surface, thereby generating a secondary light in a second wavelength band, which differs from the first wavelength band, the wavelength converting body emitting the secondary light from the exit surface; a metallic antenna group provided in a close vicinity of the wavelength converting body and including a plurality of metallic antennas disposed so as to be spaced apart from each other at a distance of substantially an optical wavelength of the secondary light in the wavelength converting body; and a dielectric antenna group including a plurality of dielectric antennas and provided so as to face the exit surface of the wavelength converting body.

In a wavelength converting element according to one aspect of the present disclosure, the metallic antenna group may have a configuration in which the plurality of metallic antennas are arranged in a lattice manner on a same plane.

In a wavelength converting element according to one aspect of the present disclosure, the dielectric antenna group may have a configuration in which the plurality of dielectric antennas are arranged in a lattice manner on a same plane.

In a wavelength converting element according to one aspect of the present disclosure, the metallic antenna group and the dielectric antenna group may be provided on a same layer to face the exit surface of the wavelength converting body.

A wavelength converting element according to one aspect of the present disclosure may further include a dielectric layer configured to cover the metallic antenna group, and the dielectric antenna group may be provided to face the metallic antenna group across the dielectric layer.

A wavelength converting element according to one aspect of the present disclosure may further include a first dichroic mirror provided to face the incident surface of the wavelength converting body, the first dichroic mirror transmitting the primary light and reflecting the secondary light.

A wavelength converting element according to one aspect of the present disclosure may further include a second dichroic mirror provided to face the exit surface of the wavelength converting body, the second dichroic mirror transmitting the secondary light and reflecting the primary light.

A wavelength converting element according to one aspect of the present disclosure may further include a light reflection layer or a light-absorbing layer provided on a surface, which differs from the incident surface and the exit surface of the wavelength converting body.

A light source device according to one aspect of the present disclosure includes the wavelength converting element according to one aspect of the present disclosure, and a light source configured to emit the primary light to the wavelength converting element.

A display device according to one aspect of the present disclosure includes the light source device according to one aspect of the present disclosure, and a light modulating device configured to modulate light from the light source device in accordance with image information.

DESCRIPTION OF EXEMPLARY EMBODIMENTS

First Embodiment

Below, a first exemplary embodiment according to the present disclosure will be described with reference to FIGS. 1 to 3.

Figure 1:
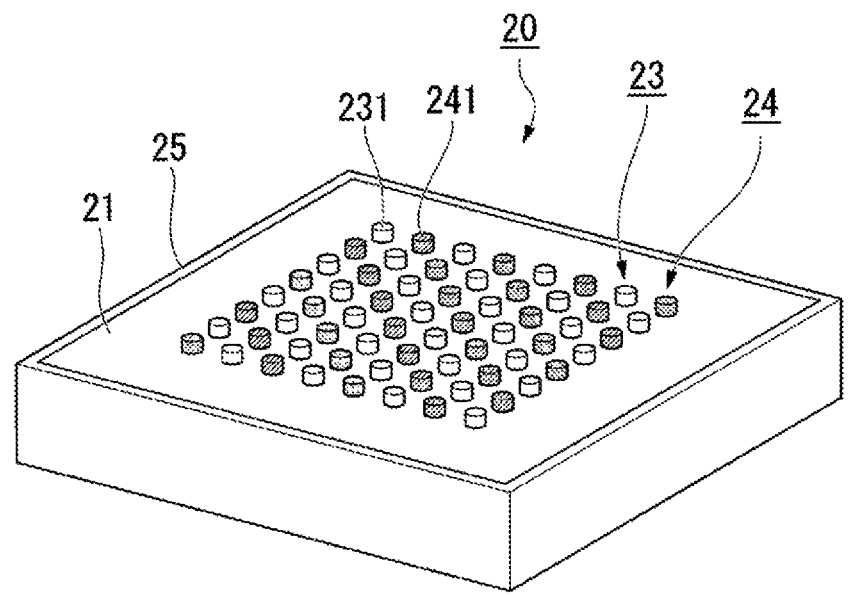
FIG. 1 is a perspective view of a wavelength converting element according to a first exemplary embodiment.

FIG. 1 is a perspective view of a wavelength converting element 20 according to the first exemplary embodiment. FIG. 2 is a plan view of the wavelength converting element 20. FIG. 3 is a cross-sectional view of the wavelength converting element 20 taken along the line III-III in FIG. 2. Note that, in the drawings, the dimensions of some components may be scaled differently for ease of understanding for the components.

Figure 2:
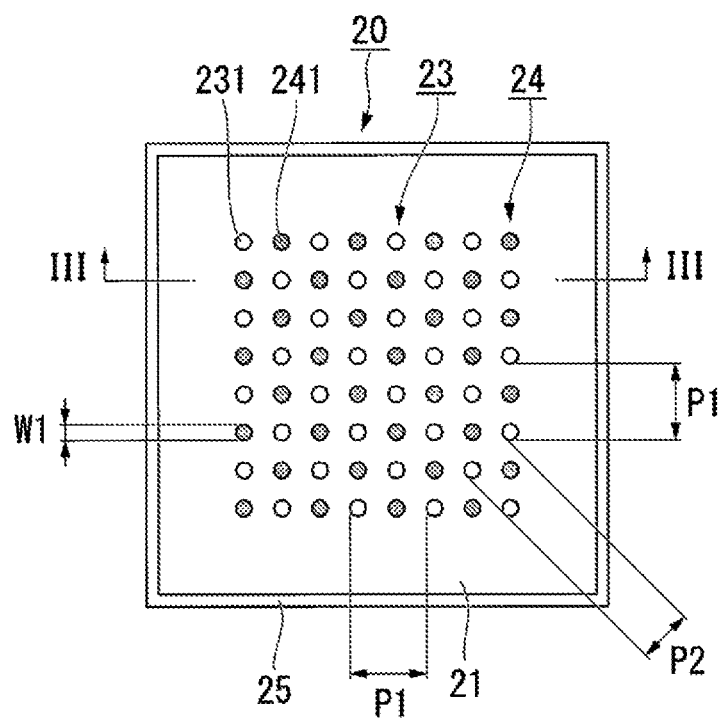
FIG. 2 is a plan view of the wavelength converting element.
Figure 3:
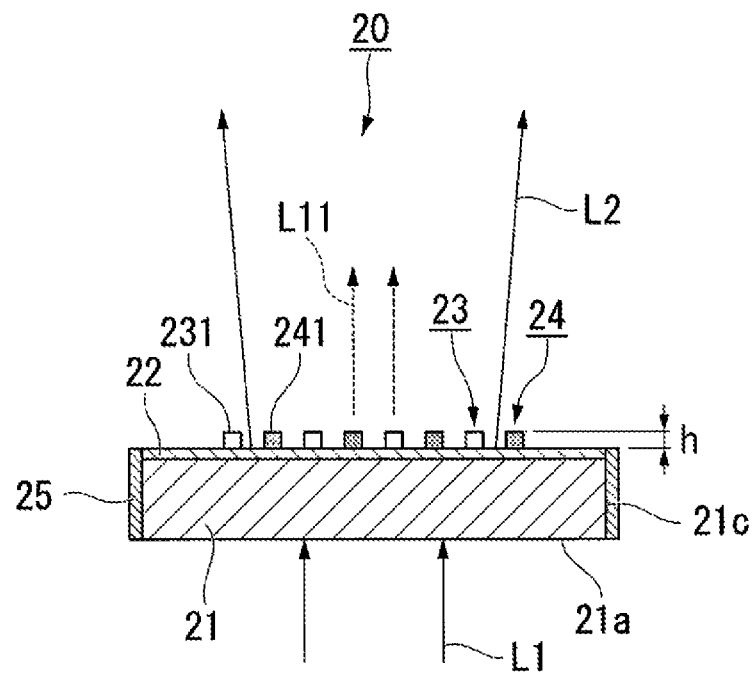
FIG. 3 is a cross-sectional view of the wavelength converting element taken along the line III-III in FIG. 2.

As illustrated in FIGS. 1 to 3, the wavelength converting element 20 according to the present exemplary embodiment includes a wavelength converting body 21, a first dielectric layer 22, a metallic antenna array 23 (metallic antenna group), a dielectric antenna array 24 (dielectric antenna group), and a light reflection layer 25. Note that the light reflection layer 25 may be a light-absorbing layer, as described below.

In this description, a plurality of antennas is collectively referred to as an antenna group. In addition, of antenna groups, an antenna group in which a plurality of antennas are arranged regularly on the same plane is particularly referred to as an antenna array.

The wavelength converting body 21 includes an incident surface 21a, an exit surface 21b, and four side surfaces 21c, and is formed into a rectangular shape when viewed from the normal-line direction of the exit surface 21b. The wavelength converting body 21 performs wavelength conversion to primary light L1 in a first wavelength band inputted from the incident surface 21a to generate secondary light L2 in a second wavelength band differing from the first wavelength band. The wavelength converting body 21 outputs the secondary light L2 from the exit surface 21b. The primary light L1 is, for example, light in a blue wavelength band (first wavelength band) ranging from 440 nm to 450 nm. Hereinafter, a plan view means a view when viewed from the normal-line direction of the exit surface 21b.

The wavelength converting body 21 is made out of inorganic phosphor such as yttrium aluminum garnet (YAG: Ce) containing cerium serving as an activator. The wavelength converting body 21 made out of YAG: Ce performs wavelength conversion to part of the primary light L1 into the secondary light L2 in a yellow wavelength band (second wavelength band) ranging from 490 nm to 750 nm, and outputs the secondary light L2 from the exit surface 21b. At this time, light L11, which is the other part of the primary light L1 that has not been wavelength converted into the secondary light L2, is outputted from the exit surface 21b together with the secondary light L2.

In addition to inorganic phosphors such as YAG: Ce, the wavelength converting body 21 may be made out of organic phosphor in which an organic fluorescent dye such as Lumogen and Rhodamine 6G is dissolved in a base material and is formed into a thin film. In this case, the base material of the organic fluorescent dye that can be used includes, for example, polymethyl methacrylate (PMMA), polycarbonate (PC), polyethylene terephthalate (PET), polyethylene naphthalate (PEN), acrylic resin, and the like.

The metallic antenna array 23 is provided in the close vicinity of the wavelength converting body 21. Note that the "close vicinity of the wavelength converting body 21" is defined as being spaced apart from the wavelength converting body 21 with a gap of not less than 10 nm and also being spaced apart from the wavelength converting body 21 with a gap of not more than 1000 nm. It is preferable that the gap is not less than 10 nm and not more than 30 nm. In addition, for a material of the gap, it is possible to use a material similar to that of the dielectric antenna 241, which will be described later. It is preferable that the refractive index of the material that forms the gap falls within ±0.3 relative to the wavelength converting body 21. In the case of the present exemplary embodiment, the metallic antenna array 23 is provided above the exit surface 21b of the wavelength converting body 21 through the first dielectric layer 22, as illustrated in FIG. 3. The thickness of the first dielectric layer 22 is 20 nm, for example.

Furthermore, the metallic antenna array 23 is provided in the close vicinity of the wavelength converting body 21, and needs to be provided such that the metallic antenna array 23 is not in direct contact with the wavelength converting body 21. The reason for this is that, when the metallic antenna array 23 is in direct contact with the wavelength converting body 21, energy of the surface plasmon polariton that has been resonantly induced in the vicinity of a metallic antenna 231 flows to the wavelength converting body 21, which makes the surface plasmon polariton deactivated.

The dielectric antenna array 24 is provided so as to face the exit surface 21b of the wavelength converting body 21. In a case of the present exemplary embodiment, the dielectric antenna array 24 is provided above the exit surface 21b of the wavelength converting body 21 through the first dielectric layer 22, as with the metallic antenna array 23. In other words, the metallic antenna array 23 and the dielectric antenna array 24 are provided above the same layer so as to be opposed to the exit surface 21b of the wavelength converting body 21.

The metallic antenna array 23 includes a plurality of metallic antennas 231 arranged so as to be spaced apart from each other at a distance of substantially an optical wavelength of the secondary light L2 in the wavelength converting body 21. In other words, the metallic antenna array 23 has a configuration in which the plurality of metallic antennas 231 is arranged in a lattice manner on the same plane. The distance between metallic antennas 231, that is, the period P1 of the metallic antenna array 23 is defined as the distance between two metallic antennas 231 arranged in a direction parallel to one side of the wavelength converting body 21 (the left-right direction or the up-down direction in FIG. 2), as illustrated in FIG. 2. In addition, the optical wavelength of the secondary light L2 in the wavelength converting body 21 is defined as the following equation (1).

Optical wavelength=wavelength of the secondary light/refractive index of wavelength converting body (1)

In the present description, "substantially an optical wavelength of the secondary light L2 in the wavelength converting body 21" represents, for example, a wavelength band in which ±50 nm is added to the wavelength band of light outputted from a phosphor in the wavelength converting body 21. Note that the period P2 of the metallic antenna array 23 may be defined as the distance between two metallic antennas 231 arranged in a diagonal direction.

On the other hand, the dielectric antenna array 24 includes a plurality of dielectric antennas 241 arranged at a pitch that allows the secondary light L2 to be diffracted at a desired diffraction angle. In other words, the dielectric antenna array 24 has a configuration in which a plurality of dielectric antennas 241 is arranged in a lattice manner on the same plane.

As illustrated in FIG. 2, in a case of the present exemplary embodiment, the plurality of metallic antennas 231 and the dielectric antennas 241 are arranged in a square lattice manner as a whole. In other words, when antennas in the top row of FIG. 2 are viewed from left to right, metallic antennas 231 and dielectric antennas 241 are alternately arranged such that a metallic antenna 231 is disposed on the left end, and then a dielectric antenna 241, a metallic antenna 231, a dielectric antenna 241, . . . are disposed. Next, when antennas in the second row from the top in FIG. 2 are viewed from left to right, dielectric antennas 241 and metallic antennas 231 are alternately arranged such that a dielectric antenna 241 is disposed on the left end, and then a metallic antenna 231, a dielectric antenna 241, a metallic antenna 231, . . . are disposed.

As illustrated in FIG. 1, each of the plurality of metallic antennas 231 and each of the plurality of the dielectric antennas 241 each have a three-dimensional structure that protrudes from the wavelength converting body 21, the structure including a pillar shape, a cone shape, and a frustum shape. In a case of the present exemplary embodiment, the metallic antenna 231 and the dielectric antenna 241 each have a cylindrical shape. In addition, when each antenna is viewed in plan view, the metallic antenna 231 and the dielectric antenna 241 can have a planar shape including various types of shapes such as a particle shape, a circle, an oval, a polygon, a ring shape, a linear shape, and a polygon. Furthermore, the metallic antenna 231 and the dielectric antenna 241 may have the same shape or may have different shapes. The arrangement of the plurality of metallic antennas 231 and the plurality of dielectric antennas 241 has periodicity. The period may be extended at a certain ratio, and includes a fractal structure.

The metallic antenna 231 has a maximum width W1 and a height h that satisfy the following equation (2), where w1 represents the maximum width of the metallic antenna 231, and h represents the height of the metallic antenna 231.

$$0.05 \leq (h/w1) \leq 2 \quad (2)$$

However, the maximum width w1 of the metallic antenna 231 is not less than 100 nm.

Note that the dielectric antenna 241 is set so as to have a radiation angle that allows the secondary light L2 having a desired wavelength to be diffracted, and hence, is not limited to the relationship of the equation (2).

The constituent material of the metallic antenna 231 includes, for example, gold (Au), silver (Ag), copper (Cu), platinum (Pt), palladium (Pd), nickel (Ni), aluminum (Al), and the like, or an alloy of these materials may be used. The constituent material of the metallic antenna 231 may be a material other than that described above, provided that it is a metal having a plasma frequency (absorption) with respect to the wavelength of the secondary light L2 that is used.

For the constituent material of the dielectric antenna 241, it is possible to use any material that is used for a dielectric multilayer film and is transparent to light in a visible range, the material including $TiO_2$, $Al_2O_3$, $LiNbO_3$, $HfO_2$, $Ta_2O_5$, SiON, $Si_3N_4$, and the like. Alternatively, it may be a stacked body of the materials described above or may be a combination thereof.

The light reflection layer 25 is provided at surfaces differing from the incident surface 21a and the exit surface 21b of the wavelength converting body 21, specifically, provided at four side surfaces 21c of the wavelength converting body 21. It is possible to form the light reflection layer 25 using a metallic film, a dielectric multilayer film, a microscopic structure, or the like formed on the side surface 21c of the wavelength converting body 21. Note that, instead of the light reflection layer 25, a light-absorbing layer may be provided on the four side surfaces 21c of the wavelength converting body 21. The light-absorbing layer can be formed using a metallic film, a dielectric multilayer film, or the like formed on the side surface 21c of the wavelength converting body 21.

Below, operation of the wavelength converting element 20 having the configuration described above will be described.

As described above, when the primary light L1 enters the wavelength converting element 20, the wavelength converting body 21 performs wavelength conversion to the primary light L1 to generate the secondary light L2. At this time, the secondary light L2 and the light L11, which is part of the primary light that has not been wavelength converted into the secondary light L2, are outputted from the exit surface 21b of the wavelength converting body 21.

At this time, when the secondary light L2 enters each metallic antenna 231 of the metallic antenna array 23, localized surface plasmon resonance occurs at the surface of the metallic antenna 231, and the electric field strength near the metallic antenna 231 increases. Here, since the period of the metallic antenna array 23 is set to substantially an optical wavelength of the secondary light L2, localized surface plasmon resonance of adjacent metallic antennas 231 resonates through light diffraction, which further increases the electric field strength. This results in an increase in intensity of the secondary light L2, improving efficiency of extracting light of the secondary light.

Furthermore, the dielectric antenna array 24 includes the plurality of dielectric antennas 241 arranged in a periodic manner, and thus functions as a diffraction grating. Thus, when the secondary light L2 enters the dielectric antenna array 24, the secondary light L2 is diffracted at a predetermined diffraction angle and is outputted from dielectric antenna array 24 with a predetermined radiation angle. A diffraction angle θm can be obtained using the following equation (3), where d represents a pitch of the dielectric antenna array 24, θm represents a diffraction angle of the secondary light L2, θ0 represents an incident angle of the secondary light L2, and λ represents a wavelength of the secondary light L2.

$$d(\sin \theta m - \sin \theta 0) = m\lambda \quad (3)$$

However, m represents the order of diffracted light (positive integer or negative integer).

The wavelength converting element 20 according to the present exemplary embodiment includes the metallic antenna array 23 and the dielectric antenna array 24. The metallic antenna array 23 and the dielectric antenna array 24 share functions in a manner such that the metallic antenna array 23 works to enhance the secondary light L2, and the dielectric antenna array 24 works to control the diffraction angle. In addition, the shape, size, pitch, and the like of the dielectric antenna 241 can be set without constraints such as the shape, size, pitch, and the like required by the metallic antenna 231. This makes it possible to achieve the wavelength 20 having a high degree of freedom in terms of wavelength selection and control of radiation angle.

In addition, in a case of the present exemplary embodiment, the metallic antenna array 23 and the dielectric antenna array 24 are provided on the same layer. Thus, it is possible to provide a thin wavelength converting element 20 having a simple configuration.

Furthermore, in a case of the present exemplary embodiment, the light reflection layer 25 is provided on the side surface 21c of the wavelength converting body 21. This enables the secondary light L2 that would be outputted from the side surface 21c of the wavelength converting body 21 if the light reflection layer 25 does not exist, to be returned to the wavelength converting body 21. This makes it possible to increase efficiency of extracting the secondary light L2 from the exit surface 21b.

Moreover, when a light-absorbing layer is provided on the side surface 21c of the wavelength converting body 21, it is possible to reduce a possibility that the secondary light L2 outputted from the side surface 21c of the wavelength converting body 21 turns into stray light within the housing of the light source device, causing noise.

Second Embodiment

Below, a second exemplary embodiment according to the present disclosure will be described with reference to FIG. 4.

While a wavelength converting element according to the second exemplary embodiment has a basic configuration similar to that of the first exemplary embodiment, the arrangement of an antenna array differs from that of the first exemplary embodiment. Thus, the entire explanation of the wavelength converting element will not be repeated.

Figure 4:
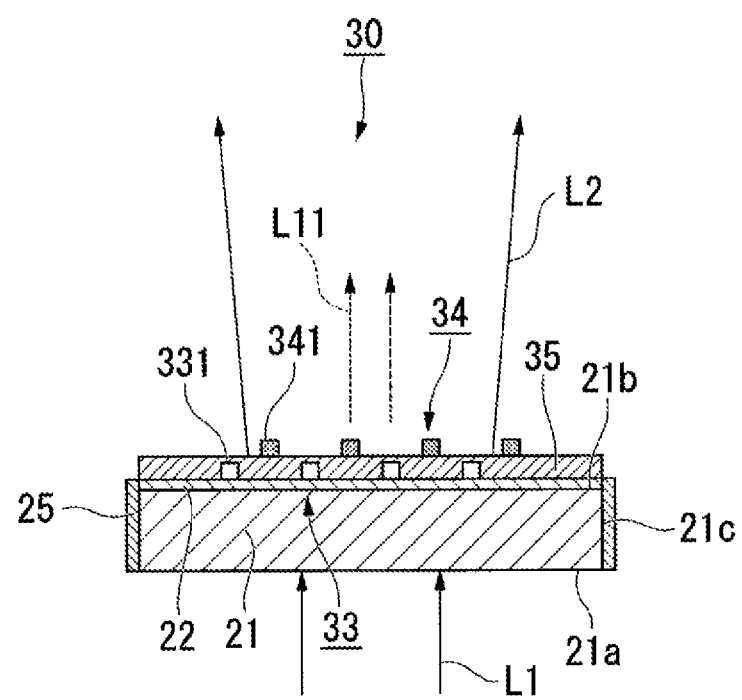
FIG. 4 is a cross-sectional view of a wavelength converting element according to a second exemplary embodiment.

FIG. 4 is a cross-sectional view of a wavelength converting element 30 according to the second exemplary embodiment.

In FIG. 4, the same reference characters are attached to constituent elements common to those in the drawings used in the first exemplary embodiment, and explanation thereof will not be repeated.

As illustrated in FIG. 4, the wavelength converting element 30 according to the present exemplary embodiment includes the wavelength converting body 21, the first dielectric layer 22, a metallic antenna array 33, a second dielectric layer 35, a dielectric antenna array 34, and the light reflection layer 25. As described above, the wavelength converting element 30 further includes the second dielectric layer 35 that covers the metallic antenna array 33. The second dielectric layer 35 according to the present exemplary embodiment corresponds to the dielectric layer of the claims.

In the present exemplary embodiment, the metallic antenna array 33 is provided above the exit surface 21b of the wavelength converting body 21 through the first dielectric layer 22, as in the first embodiment.

Furthermore, the second dielectric layer 35 is provided so as to cover the metallic antenna array 33. Recesses and protrusions due to metallic antennas 331 are filled with the second dielectric layer 35 to be flattened.

The dielectric antenna array 34 is provided above an upper surface of the second dielectric layer 35. In other words, the dielectric antenna array 34 is provided so as to be opposed to the metallic antenna array 33 with the second dielectric layer 35 being disposed therebetween. That is, in the first exemplary embodiment, the metallic antenna array 23 and the dielectric antenna array 24 are provided on the same layer. However, in the second exemplary embodiment, the metallic antenna array 33 and the dielectric antenna array 34 are provided on different layers, and the dielectric antenna array 34 is provided on a layer higher than a layer on which the metallic antenna array 33 is provided.

For the constituent material of the second dielectric layer 35, it is possible to use, for example, $TiO_2$, $Al_2O_3$, $LiNbO_3$, $HfO_2$, $Ta_2O_5$, $SiON$, $Si_3N_4$, or the like, which are similar to that of the dielectric antenna, as with the first dielectric layer 22. The thickness of the second dielectric layer 35 is 100 nm, for example. In the present exemplary embodiment, the thickness of each of the layers is set, as an example, such that the thickness of the wavelength converting body 21 (YAG: Ce) is 200 µm, the thickness of the first dielectric layer 22 ($TiO_2$) is 20 nm, the thickness of the metallic antenna 331 (Ag) is 20 nm, the thickness of the second dielectric layer 35 ($TiO_2$) is 100 nm, and the thickness of the dielectric antenna 341 ($TiO_2$) is 200 nm.

In plan view, the positional relationship between the plurality of metallic antennas 331 and the plurality of dielectric antennas 341 is similar to that in the first exemplary embodiment. In other words, the plurality of metallic antennas 331 and the dielectric antennas 341 are arranged in a square lattice manner as a whole. When viewed along a direction parallel to one side of the wavelength converting body 21, the metallic antenna 331 and the dielectric antenna 341 are disposed alternately.

The other configurations of the wavelength converting element 30 are similar to those in the first exemplary embodiment.

The present exemplary embodiment can provide an effect similar to that of the first exemplary embodiment, and it is possible to achieve the wavelength converting element 30 having a high degree of freedom in terms of wavelength selection and control of radiation angle.

In addition, in a case of the present exemplary embodiment, the plurality of dielectric antennas 341 is provided on a different layer from the plurality of metallic antennas 331 with the second dielectric layer 35 being disposed therebetween, which makes it possible to increase the degree of freedom of arrangement of the dielectric antennas 341. For example, it is possible to employ a configuration of a first modification example described below.

First Modified Example

Figure 5:
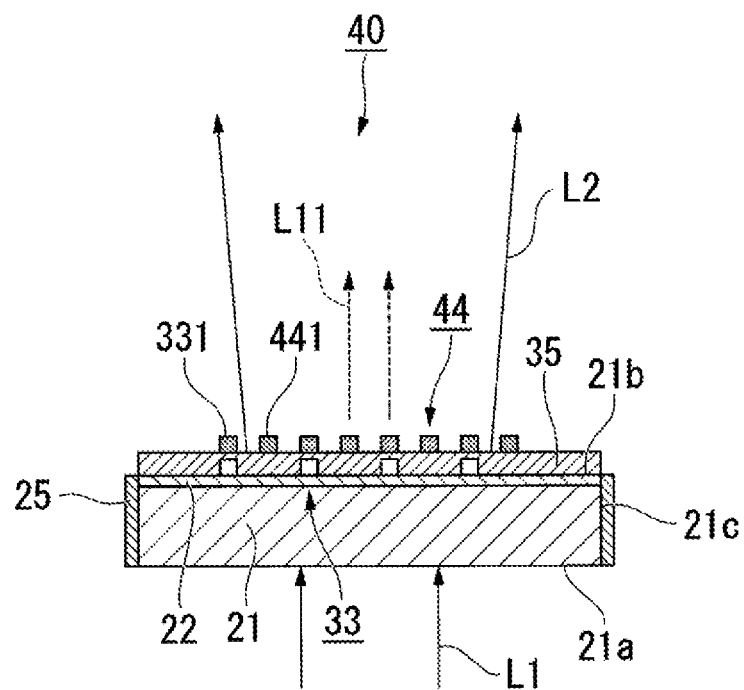
FIG. 5 is a cross-sectional view of a wavelength converting element according to a first modification example.

FIG. 5 is a cross-sectional view of a wavelength converting element 40 according to a first modification example.

In the wavelength converting element 40 according to the first modification example, some dielectric antennas 441 of a plurality of dielectric antennas 441 that constitute a dielectric antenna array 44 are disposed immediately above the metallic antenna 331, as illustrated in FIG. 5. In other words, some dielectric antennas 441 are disposed at positions overlapping with the metallic antenna 331 in plan view. This makes it possible to freely set the pitch of the dielectric antenna array 44 in a manner such that it is narrower than the pitch of the metallic antenna array 33.

Second Modified Example

Figure 6:
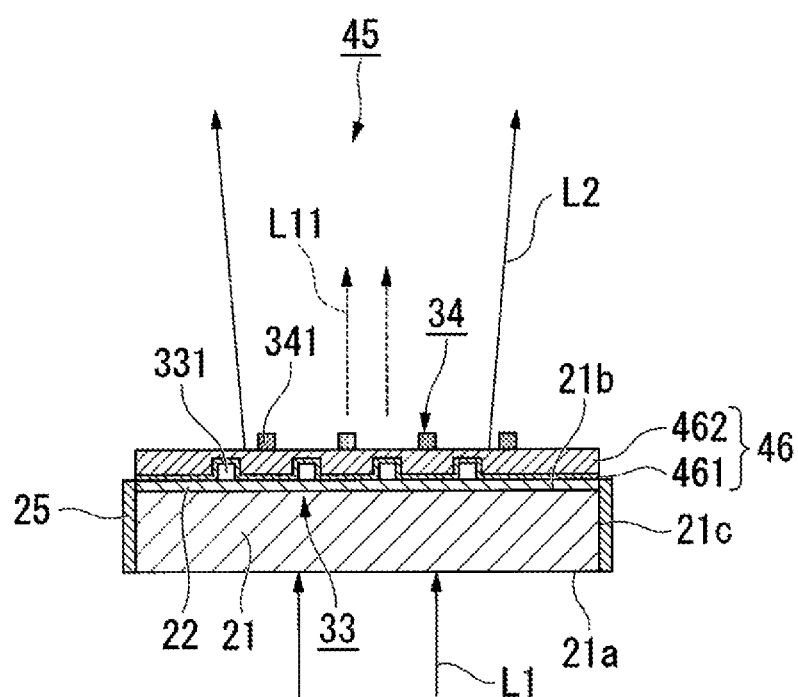
FIG. 6 is a cross-sectional view of a wavelength converting element according to a second modification example.

FIG. 6 is a cross-sectional view of a wavelength converting element 45 according to a second modification example.

In the wavelength converting element 45 according to the second modification example, a second dielectric layer 46 includes two layers of dielectric layers including a base dielectric layer 461 and a planarizing dielectric layer 462, as illustrated in FIG. 6. The base dielectric layer 461 is comprised of a thin film formed such that it covers each of the metallic antennas 331, and reflects the shape of the metallic antennas 331. The planarizing dielectric layer 462 further covers the base dielectric layer 461 and flattens the unevenness due to the metallic antenna 331.

In the present modification example, the thickness of each of the layers is set, as an example, such that the thickness of the wavelength converting body 21 (YAG: Ce) is 200 μm, the thickness of the first dielectric layer 22 ($TiO_2$) is 20 nm, the thickness of the metallic antenna 331 (Ag) is 20 nm, the thickness of the base dielectric layer 461 ($TiO_2$) is 20 nm, the thickness of the planarizing dielectric layer 462 ($Si_3N_4$) is 50 nm, and the thickness of the dielectric antenna 341 ($TiO_2$) is 200 nm.

The planarizing dielectric layer 462 may be replaced with other types of wavelength converting body. For example, by replacing $Si_3N_4$ as described above with PMMA to which Lumogen F Red (available from BASF) is added, it is possible to achieve enhancement while adding a spectrum of red color to the yellow light emitted through fluorescence by YAG: Ce. Here, the enhancement of the metallic antenna 331 due to the surface plasmon polariton can contribute to the wavelength converting body 21 existing in the close vicinity thereof. Thus, it is also possible to obtain a fluorescent enhancement effect of Lumogen.

When the dielectric antenna array 24 is disposed on the same layer as the metallic antenna array 23 as in the first exemplary embodiment, the metallic antenna 241 needs to be disposed between metallic antennas 231 so that the dielectric antenna 241 does not overlap with the metallic antenna 231, which results in a lack of the degree of freedom in terms of arrangement of the dielectric antenna 241. On the other hand, in a case of the present exemplary embodiment, it is possible to arrange the dielectric antenna 441 at a position where the dielectric antenna 441 overlaps with the metallic antenna 331 in plan view as illustrated, for example, in FIG. 5, which results in an increased degree of freedom in terms of arrangement of the dielectric antenna 441. Thus, with the wavelength converting element 30, 40, and 45 according to the present exemplary embodiment and the modification examples, it is easy to control a desired radiation angle with a higher degree of freedom.

In addition, as for the metallic antenna array 33, it is not necessary to take the radiation angle control into consideration, and hence, it is possible to increase a degree of freedom in terms of arrangement of the plurality of metallic antennas 331. Thus, it is possible to induce the surface plasmon polariton in a more efficient and more selective manner.

Third Embodiment

Below, a third exemplary embodiment according to the present disclosure will be described with reference to FIG. 7.

The basic configuration of a wavelength converting element according to the third exemplary embodiment is similar to that in the first exemplary embodiment, and differs from that of the first exemplary embodiment in that two dichroic mirrors are provided. Thus, the entire explanation of the wavelength converting element will not be repeated.

Figure 7:
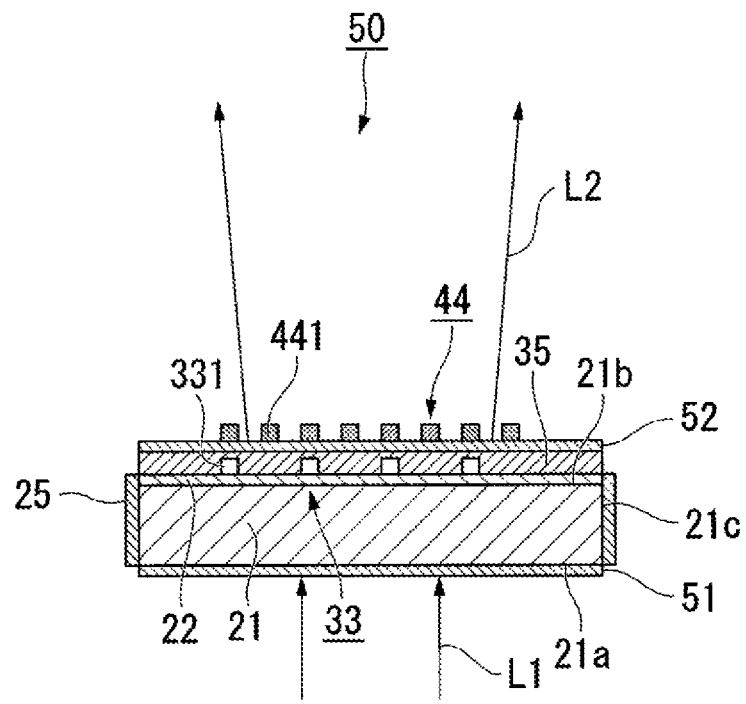
FIG. 7 is a cross-sectional view of a wavelength converting element according to a third exemplary embodiment.

FIG. 7 is a cross-sectional view of a wavelength converting element 50 according to the third exemplary embodiment.

In FIG. 7, the same reference characters are attached to constituent elements common to those in the drawings used in the first exemplary embodiment, and explanation thereof will not be repeated.

As illustrated in FIG. 7, the wavelength converting element 50 according to the present exemplary embodiment includes the wavelength converting body 21, the first dielectric layer 22, the metallic antenna array 33, the second dielectric layer 35, the dielectric antenna array 44, the light reflection layer 25, a first dichroic mirror 51, and a second dichroic mirror 52.

The first dichroic mirror 51 is provided so as to face the incident surface 21a of the wavelength converting body 21. The first dichroic mirror 51 includes a dielectric multilayer film. The first dichroic mirror 51 has a light separating property in which light of a wavelength band of blue is transmitted and light of a wavelength band of yellow is reflected. Thus, the first dichroic mirror 51 allows the primary light L1 that travels from the outside toward the incident face 21a of the wavelength converting body 21 to be transmitted, and reflects the secondary light L2 generated inside the wavelength converting body 21.

In the present exemplary embodiment, there is provided the second dielectric layer 35 that faces the exit surface 21b of the wavelength converting body 21 and covers the metallic antenna array 33, as in the second exemplary embodiment illustrated in FIG. 4. The second dichroic mirror 52 is provided on the second dielectric layer 35 so as to be opposed to the exit surface 21b of the wavelength converting body 21. The dielectric antenna array 44 is provided on the second dichroic mirror 52. The second dichroic mirror 52 includes a dielectric multilayer film. The second dichroic mirror 52 has a light separating property in which light of a wavelength band of yellow is transmitted and light of a wavelength band of blue is reflected. Thus, the second dichroic mirror 52 allows the secondary light L2 outputted from the exit face 21b of the wavelength converting body 21 to be transmitted, and reflects the primary light L1 that has passed through the inside of the wavelength converting body 21.

The other configurations of the wavelength converting element 50 are similar to those in the first exemplary embodiment.

The present exemplary embodiment can provide an effect similar to that of the first exemplary embodiment, and it is possible to achieve the wavelength converting element 50 having a high degree of freedom in terms of wavelength selection and control of radiation angle.

Furthermore, in a case of the present exemplary embodiment, the first dichroic mirror 51 that reflects the secondary light L2 is provided so as to face the incident surface 21a of the wavelength converting body 21. This prevents the secondary light L2 generated inside the wavelength converting body 21 from leaking from the incident surface 21a to the outside, which makes it possible to reduce a loss of the secondary light L2.

In addition, the second dichroic mirror 52 that reflects the primary light L1 is provided so as to be opposed to the exit surface 21b of the wavelength converting body 21. This makes it possible for the primary light L1 that is not wavelength converted and arrives at the exit surface 21b to be returned to the wavelength converting body to cause it to contribute to wavelength conversion, which makes it possible to enhance conversion efficiency for the primary light L1.

In a case of the present exemplary embodiment, the second dichroic mirror 52 is provided. With this configuration, the light L11 that is part of the primary light is not outputted from the wavelength converting element 50. Thus, the yellow secondary light L2 is the only light that is outputted from the wavelength converting element 50. When the wavelength converting element 50 is used in applications where white light is necessary, an anti-reflective film may be provided instead of the second dichroic mirror 52.

Fourth Embodiment

Below, a fourth exemplary embodiment according to the present disclosure will be described with reference to FIG. 8.

While the basic configuration of a wavelength converting element according to the fourth exemplary embodiment is similar to that of the first exemplary embodiment, the configuration of metallic antenna array differs from that of the first exemplary embodiment. Thus, the entire explanation of the wavelength converting element will not be repeated. FIG. 8 is a plan view of a wavelength converting element 60 according to the fourth exemplary embodiment. Note that only the metallic antenna array 61 is illustrated in FIG. 8, and no dielectric antenna array is illustrated in FIG. 8. The dielectric antenna array may be provided on the same layer as the metallic antenna array 61, or may be provided on a different layer from the metallic antenna array 61.

Figure 8:
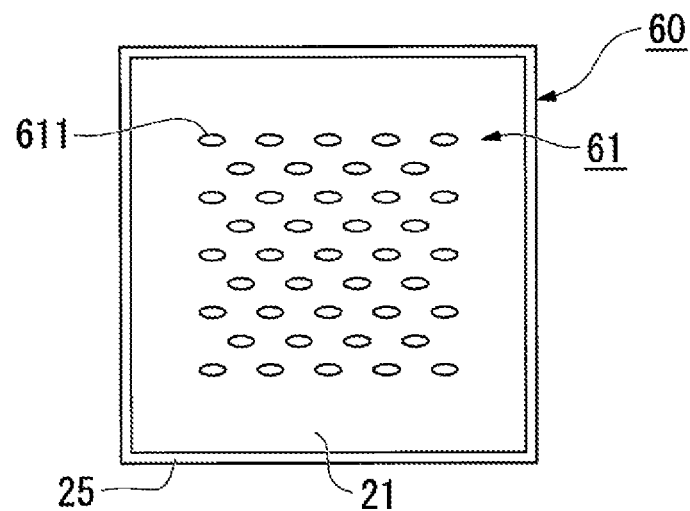
FIG. 8 is a plan view of a wavelength converting element according to a fourth exemplary embodiment.

In FIG. 8, the same reference characters are attached to constituent elements common to those in the drawings used in the first exemplary embodiment, and explanation thereof will not be repeated.

In the wavelength converting element 60 according to the present exemplary embodiment, the metallic antenna array 61 includes a plurality of metallic antennas 611, as illustrated in FIG. 8. The plurality of metallic antennas 611 is arranged such that the metallic antennas 611 in adjacent rows in the vertical direction are disposed so as to be positionally shifted by a half pitch in the left and right direction. In this manner, the plurality of metallic antennas 611 is arranged in a so-called rhombic-lattice shape. The planar shape of each metallic antenna 611 is elliptical shape.

The rest of the configuration of the wavelength converting element 60 is similar to that in the exemplary embodiments described above.

The present exemplary embodiment can provide an effect similar to that of the first exemplary embodiment, and it is possible to achieve the wavelength converting element 60 having a high degree of freedom in terms of wavelength selection and control of radiation angle.

The plurality of metallic antennas 611 may be arranged in accordance with the following modification example.

Third Modified Example

Figure 9:
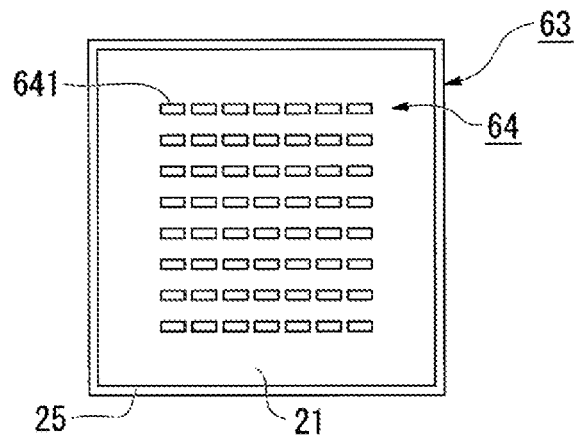
FIG. 9 is a cross-sectional view of a wavelength converting element according to a third modification example.

FIG. 9 is a plan view of a wavelength converting element 63 according to a third modification example.

In the wavelength converting element 63 according to the present modification example, a metallic antenna array 64 includes a plurality of metallic antennas 641, as illustrated in FIG. 9. The plurality of metallic antennas 641 is arranged in a rectangular lattice manner with different pitches in the vertical direction and the left and right direction. The planar shape of each metallic antenna 641 is a rectangular shape.

Fourth Modification Example

Figure 10:
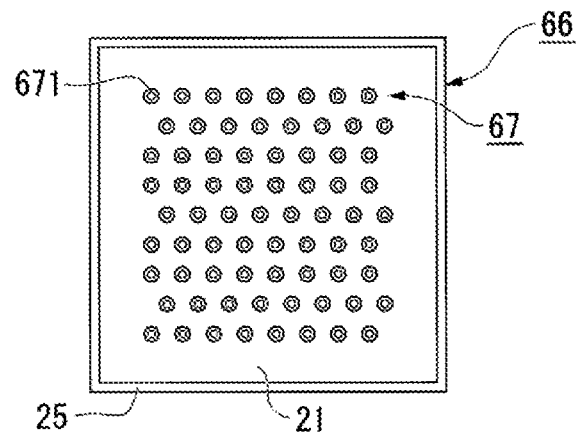
FIG. 10 is a cross-sectional view of a wavelength converting element according to a fourth modification example.

FIG. 10 is a plan view of a wavelength converting element 66 according to a fourth modification example.

In the wavelength converting element 66 according to the present modification example, a metallic antenna array 67 includes a plurality of metallic antennas 671, as illustrated in FIG. 10. The plurality of metallic antennas 671 is arranged such that the metallic antennas 671 in adjacent rows in the vertical direction are disposed so as to be positionally shifted by a half pitch in the left and right direction. In this manner, the plurality of metallic antennas 671 is arranged in a so-called hexagonal lattice shape. The shape of each of the metallic antennas 671 is a frustoconical shape.

Furthermore, the shape of each metallic antenna 611 may have the following modification examples.

FIGS. 11 to 17 are plan views illustrating other examples of shapes of a metallic antenna.

Figure 11:
FIG. 11 is a plan view of another example of a metallic antenna.

As illustrated in FIG. 11, the metallic antenna 681 may have a shape of a letter L.

Figure 12:
FIG. 12 is a plan view of yet another example of a metallic antenna.

As illustrated in FIG. 12, the metallic antenna 682 may have a hexagonal shape.

Figure 13:
FIG. 13 is a plan view of yet another example of a metallic antenna.

As illustrated in FIG. 13, the metallic antenna 683 may have a trapezoidal shape.

Figure 14:
FIG. 14 is a plan view of yet another example of a metallic antenna.

As illustrated in FIG. 14, the metallic antenna 684 may have a shape of a cross.

Figure 15:
FIG. 15 is a plan view of yet another example of a metallic antenna.

As illustrated in FIG. 15, the metallic antenna 685 may have a shape in which a shape of a sector portion is cut from a circle.

Figure 16:
FIG. 16 is a plan view of yet another example of a metallic antenna.

As illustrated in FIG. 16, the metallic antenna 686 may have a shape of rectangular ring.

Figure 17:
FIG. 17 is a plan view of yet another example of a metallic antenna.

As illustrated in FIG. 17, the metallic antenna 687 may have a shape in which a portion of the circular ring is broken.

As described above, it is possible to select the arrangement of and the shape of the metallic antenna with high degrees of freedom. In addition, of the arrangements and shapes described above, it may be possible to combine different arrangements and shapes of metallic antennas. For example, by combining metallic antennas having different shapes, it is possible to control the electric field strength or the electric field distribution of the surface plasmon polariton induced in the surface of the wavelength converting element.

Fifth Exemplary Embodiment

Below, a fifth exemplary embodiment according to the present disclosure will be described with reference to FIG. 18.

While a wavelength converting element according to the fifth exemplary embodiment has a basic configuration similar to that of the first exemplary embodiment, the configuration of the metallic antenna array of the wavelength converting element differs from that in the first exemplary embodiment. Thus, the entire explanation of the wavelength converting element will not be repeated. FIG. 18 is a plan view of a wavelength converting element 70 according to the fifth exemplary embodiment. Note that, in FIG. 18, only a metallic antenna array 71 is illustrated, and no dielectric antenna array is illustrated. The dielectric antenna array may be provided on the same layer as the metallic antenna array 71, or may be provided on a layer differing from the metallic antenna array 71.

Figure 18:
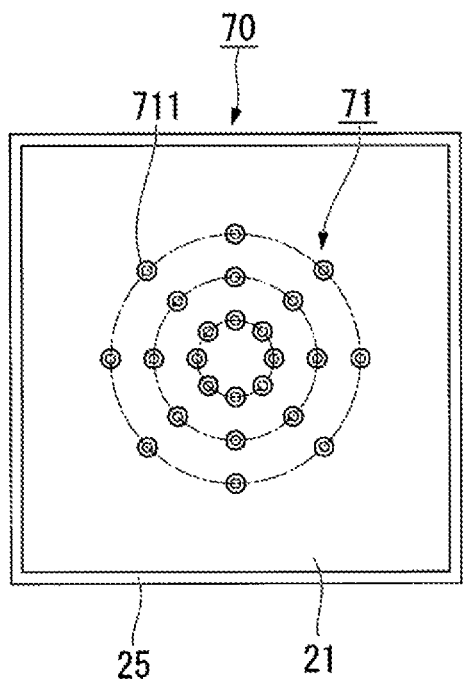
FIG. 18 is a plan view of a wavelength converting element according to a fifth exemplary embodiment.

In FIG. 18, the same reference characters are attached to constituent elements common to those in the drawings used in the first exemplary embodiment, and explanation thereof will not be repeated.

In the wavelength converting element 70 according to the present exemplary embodiment, the metallic antenna array 71 includes a plurality of metallic antennas 711, as illustrated in FIG. 18. The plurality of metallic antennas 711 is arranged concentrically at a predetermined pitch along the circumferential direction. The pitch between metallic antennas 711 arranged on each circle along the circumferential direction differs from circle to circle. In a case of the present exemplary embodiment, the pitch of metallic antennas 711 arranged in circles close to the center portion of the wavelength converting element 70 is narrow, whereas the pitch of metallic antennas 711 arranged in circles close to the peripheral edge portion of the wavelength converting element 70 is wide.

The rest of the configuration of the wavelength converting element 70 is similar to that in the exemplary embodiments described above.

The present exemplary embodiment can provide an effect similar to that of the first exemplary embodiment, and it is possible to achieve the wavelength converting element 70 having a high degree of freedom in terms of wavelength selection and control of radiation angle.

As in the present exemplary embodiment, the pitch between metallic antennas 711 is not necessarily constant in the plane of the wavelength converting element 70, and may be extended in a certain location in various types of arrangement such as concentric circles, square lattice shapes, and the like. In this manner, by changing the arrangement of and the pitch between metallic antennas 711 in a plane, it is possible to control electric field strength or electric field distribution of the surface plasmon polariton induced in the surface of the wavelength converting element 70.

Sixth Exemplary Embodiment

Below, a sixth exemplary embodiment according to the present disclosure will be described with reference to FIG. 19.

While a wavelength converting element according to the sixth exemplary embodiment has a basic configuration similar to that of the first exemplary embodiment, the configuration of the metallic antenna array differs from that in the first exemplary embodiment. Thus, the entire explanation of the wavelength converting element will not be repeated. FIG. 19 is a cross-sectional view of a wavelength converting element 80 according to the sixth exemplary embodiment.

Figure 19:
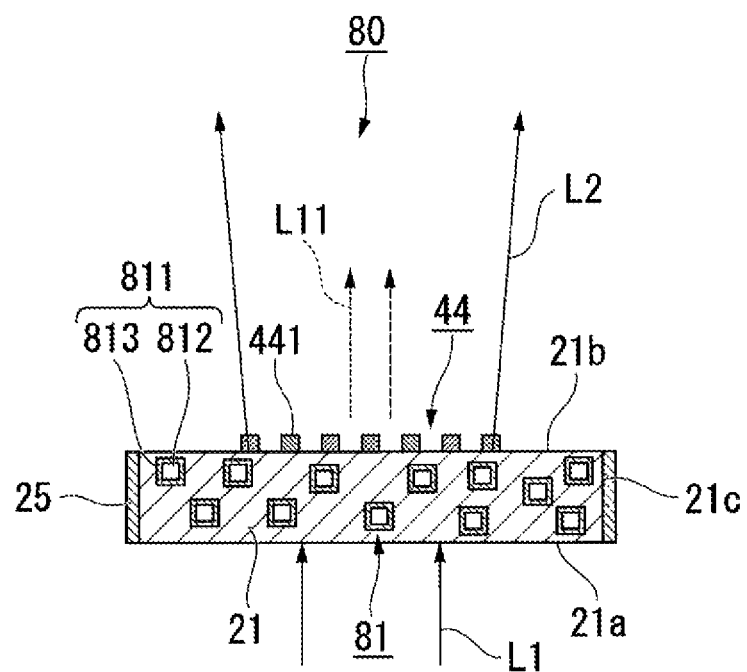
FIG. 19 is a cross-sectional view of a wavelength converting element according to a sixth exemplary embodiment.

In FIG. 19, the same reference characters are attached to constituent elements common to those in the drawings used in the first exemplary embodiment, and explanation thereof will not be repeated.

As illustrated in FIG. 19, the wavelength converting element 80 according to the present exemplary embodiment includes the wavelength converting body 21, a metallic antenna group 81, the dielectric antenna array 44, and the light reflection layer 25. In a case of the present exemplary embodiment, the light reflection layer 25 may be a light-absorbing layer, as in the first exemplary embodiment.

The metallic antenna group 81 includes a plurality of metallic antennas 811 spreading out within the wavelength converting body 21. Each of the plurality of metallic antennas 811 includes a metallic particle 812 and a dielectric coating layer 813 that covers the periphery of the metallic particle 812. It is preferable that the dielectric coating layer 813 has a thickness of not less than 10 nm and not more than 30 nm, as with the first dielectric layer 22 according to the first exemplary embodiment. In a case of the present exemplary embodiment, this structure results in the metallic antenna group 81 being not in direct contact with the wavelength converting body 21 and be located in the close vicinity of the wavelength converting body 21. For example, the wavelength converting body 21 according to the present exemplary embodiment can be manufactured in a manner such that metallic particles having a diameter of substantially 100 nm and having the periphery coated with a dielectric material are caused to spread out at the time when Lumgen F Red serving as phosphor particles is caused to spread out in PMMA.

In a case of the present exemplary embodiment, the metallic antenna group 81 is disposed inside the wavelength converting body 21. Thus, the first dielectric layer 22 is not provided on the exit face 21b of the wavelength converting body 21, and only the dielectric antenna array 44 is provided.

The rest of the configuration of the wavelength converting element 80 is similar to that in the first exemplary embodiment.

The present exemplary embodiment can provide an effect similar to that of the first exemplary embodiment, and it is possible to achieve the wavelength converting element 80 having a high degree of freedom in terms of wavelength selection and control of radiation angle.

In particular, in a case of the present exemplary embodiment, localized plasmon is induced in the vicinity of the metal particle 812. This leads to enhancement of the secondary light L2 (fluorescence) at a wavelength that corresponds to types and particle size of the metal. Unlike surface plasmon polariton, when localized plasmon is used, the degree of enhancement of electric field strength reduces at the surface. However, it is possible to facilitate the enhancement in the entire volume of the wavelength converting body 21.

In addition, in a case of the present exemplary embodiment, the plurality of dielectric antennas 441 is not disposed on the same layer as the plurality of metallic antennas 811, as in the second exemplary embodiment. Thus, it is possible to increase the degree of freedom in terms of arrangement of the plurality of dielectric antennas 441. This provides an effect of more easily controlling the desired radiation angle with a higher degree of freedom. In particular, in a case of the present exemplary embodiment, the plurality of metallic antennas 811 is not on the same plane, and spreads out inside the wavelength converting body 21 in a random manner. Thus, by appropriately adjusting the concentration of the metal particles in the manufacturing process, it is possible to achieve a desired pitch range between the metallic antennas 811.

Light Source Device

A light source device according to the present exemplary embodiment of the present disclosure will be described.

Figure 20:
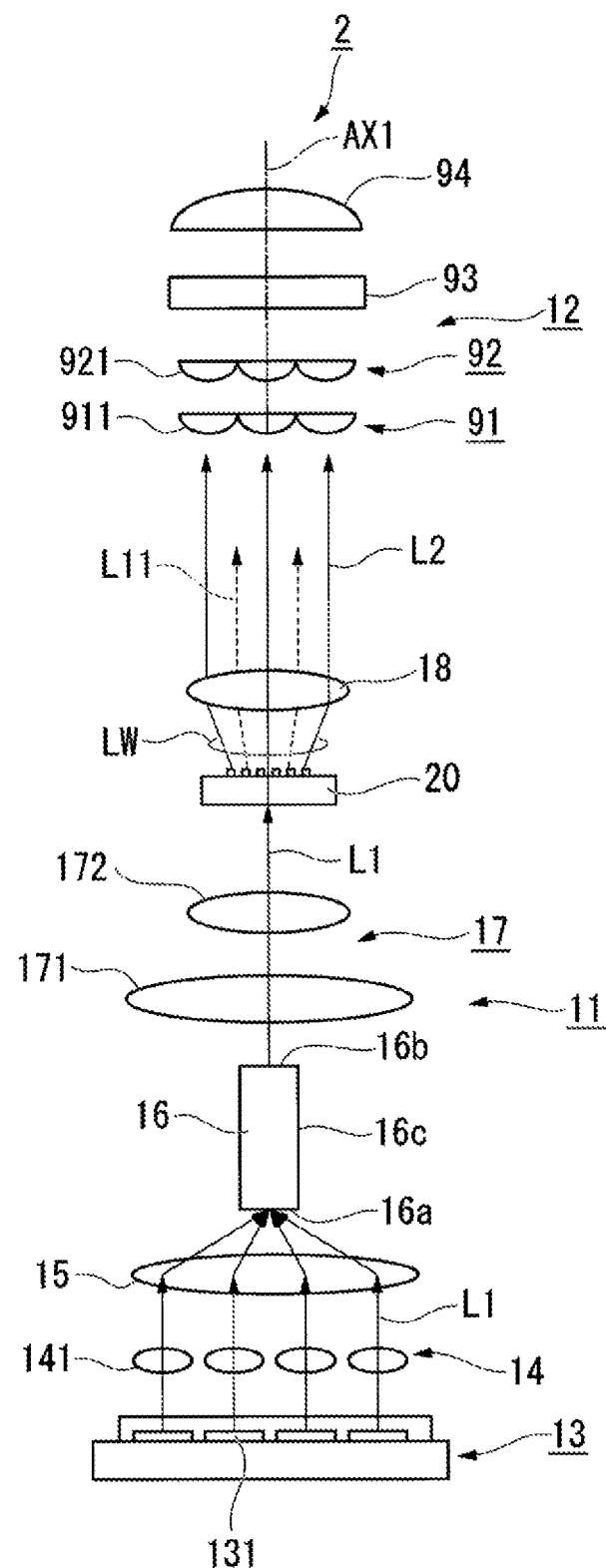
FIG. 20 is a schematic configuration diagram illustrating a light source device.

FIG. 20 is a schematic configuration diagram illustrating a light source device 2.

As illustrated in FIG. 20, the light source device 2 includes a light source unit 11 and an equalizing illumination optical system 12.

The light source unit 11 includes a light source 13, a collimator optical system 14, a first light-collecting optical system 15, a rod integrator 16, a second light-collecting optical system 17, the wavelength converting element 20, and a pickup optical system 18. The light source 13 outputs the primary light L1 toward the wavelength converting element 20.

The light source 13 includes a plurality of semiconductor lasers 131 that output blue primary light L1 having a first wavelength band. The primary light L1 is light in a blue wavelength band (first wavelength band) ranging from 440 nm to 450 nm with the peak wavelength of the light emission intensity being 445 nm. The plurality of semiconductor lasers 131 is arranged in an array manner in a plane orthogonal to the illumination optical axis AX1. The semiconductor lasers 131 may output the primary light L1 having a peak wavelength of other than 445 nm, for example, of 455 nm or 460 nm.

The collimator optical system 14 is provided between the light source 13 and the first light-collecting optical system 15. The collimator optical system 14 includes a plurality of collimator lenses 141. The collimator lenses 141 are each provided so as to correspond to each of the semiconductor lasers 131 and are arranged in an array in a plane orthogonal to the illumination optical axis AX1. The collimator lens 141 causes the primary light L1 outputted from the corresponding semiconductor laser 131 to be in parallel.

The first light-collecting optical system 15 is provided between the collimator optical system 14 and the rod integrator 16. The first light-collecting optical system 15 collects the primary light L1 outputted from the collimator optical system 14, and causes the light to enter the rod integrator 16. The first light-collecting optical system 15 includes, for example, a convex lens. The first light-collecting optical system 15 may include a plurality of lenses.

The rod integrator 16 is provided between the first light-collecting optical system 15 and the second light-collecting optical system 17. The rod integrator 16 is made out of an optical transparent member having a quadrangular prism shape, and includes a light incident end surface 16a, a light exit end surface 16b, and four reflection surfaces 16c. The primary light L1 passes through the rod integrator 16 while repeating reflection on the reflection surfaces 16c of the rod integrator 16. This makes the distribution of intensity uniform.

The second light-collecting optical system 17 is provided between the rod integrator 16 and the wavelength converting element 20. The second light-collecting optical system 17 collects the primary light L1 outputted from the rod integrator 16 to cause it to enter the wavelength converting element 20. The second light-collecting optical system 17 includes a first lens 171 and a second lens 172 each made out of, for example, a convex lens.

The wavelength converting element 20 performs wavelength conversion to the primary light L1 outputted from the light source 13 to generate the secondary light L2, and outputs white light LW including the secondary light L2 and the light L11 that is part of the primary light L1 that has not been wavelength converted. Any of the wavelength converting elements according to the exemplary embodiments described above may be used as the wavelength converting element 20.

The pickup optical system 18 is provided between the wavelength converting element 20 and the equalizing illumination optical system 12. The pickup optical system 18 causes the white light LW outputted from the wavelength converting element 20 to be in parallel, and guides it to the equalizing illumination optical system 12. The pickup optical system 18 includes, for example, a convex lens. The pickup optical system 18 may include a plurality of lenses.

The equalizing illumination optical system 12 includes a first lens array 91, a second lens array 92, a polarization conversion element 93, and a superimposing lens 94.

The first lens array 91 includes a plurality of first lenses 911 that causes the white light LW outputted from the pickup optical system 18 to be split into a plurality of partial luminous flux. The plurality of first lenses 911 is arranged in a matrix manner in a plane orthogonal to the illumination optical axis AX1.

The second lens array 92 includes a plurality of second lenses 921 corresponding to the plurality of first lenses 911 of the first lens array 91. The second lens array 92 together with the superimposing lens 94 forms an image from each of the first lenses 911 of the first lens array 91, the image being formed in the vicinity of an image formation region of a light modulating device 4R, 4G, 4B. The plurality of second lenses 921 is arranged in a matrix manner in a plane orthogonal to the illumination optical axis AX1.

The polarization conversion element 93 has a function of aligning the polarization direction of the white light LW into one direction. Although not illustrated, the polarization conversion element 93 includes a polarization separation film, a phase difference plate, and a mirror. The polarization conversion element 93 converts the other polarization component into one polarization component in order to align the polarization direction of the white light LW. For example, the polarization conversion element 93 converts a P-polarized light component into an S-polarized light component.

The superimposing lens 94 collects each partial luminous flux from the polarization conversion element 93 to superimpose each other in the vicinity of the image formation region of the light modulating device 4R, 4G, 4B. The first lens array 91, the second lens array 92, and the superimposing lens 94 constitute an integrator optical system that allows the in-plane light intensity distribution of white light LW to be uniform.

The light source device 2 according to the present exemplary embodiment includes the wavelength converting element 20 according to the exemplary embodiments described above. Thus, white light enhanced by the wavelength converting element 20 is outputted from the wavelength converting element 20 at a desired radiation angle. This reduces the optical vignetting in optical systems at stages disposed after the wavelength converting element 20. Thus, it is possible to achieve the light source device 2 having high light intensity and high light utilization efficiency.

Projector

Below, a projector 1 (display device) according to one exemplary embodiment of the present disclosure will be described.

Figure 21:
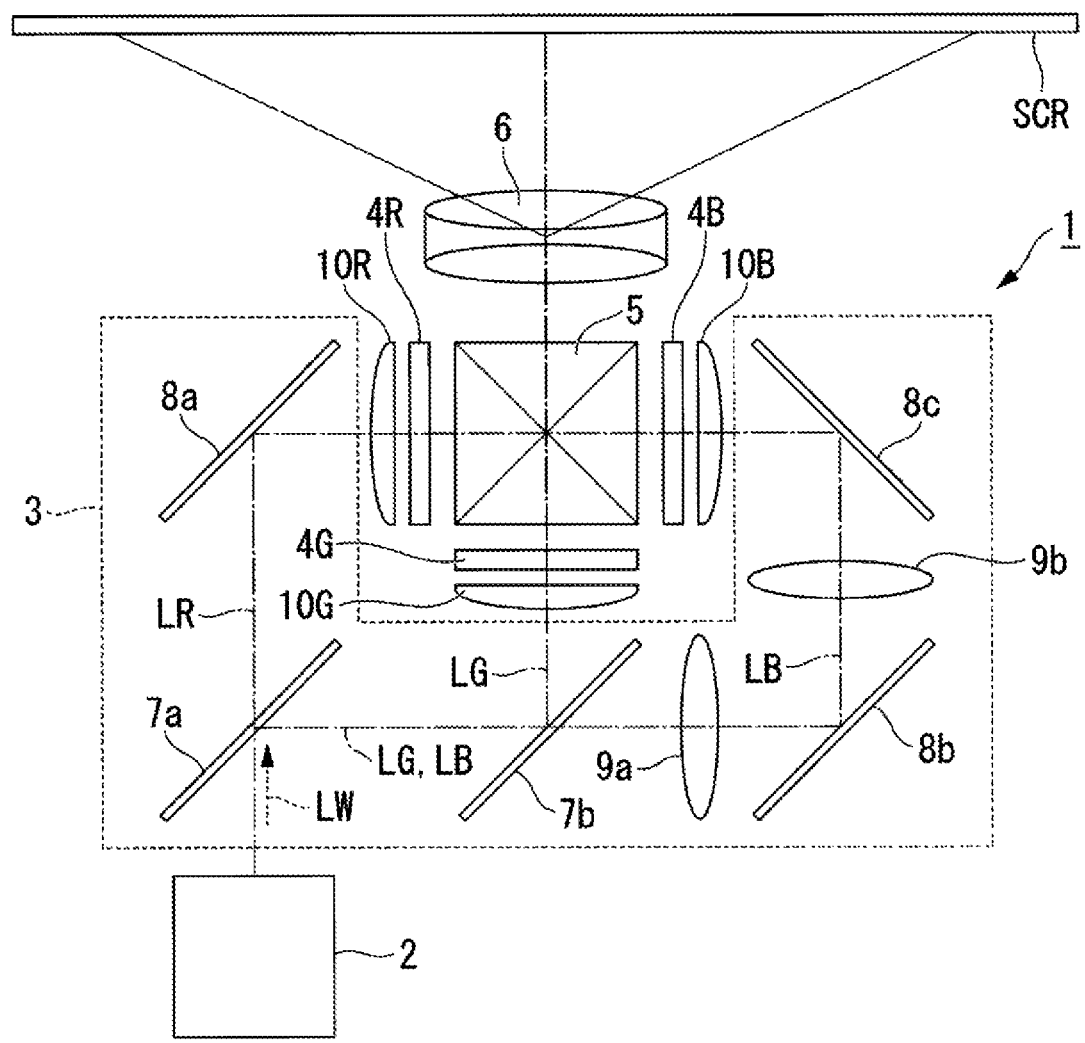
FIG. 21 is a schematic configuration diagram illustrating a projector.

FIG. 21 is a schematic configuration diagram illustrating a projector 1.

As illustrated in FIG. 21, the projector 1 according to the present exemplary embodiment is a projection-type image display device that displays a color image on a screen SCR. The projector 1 includes the light source device 2, a color separation optical system 3, the light modulating device 4R, the light modulating device 4G, the light modulating device 4B, a light synthesizing optical system 5, and a projection optical device 6. As the light source device, the light source device according to the exemplary embodiment described above and illustrated in FIG. 20 is used.

The color separation optical system 3 includes a first dichroic mirror 7a, a second dichroic mirror 7b, a reflection mirror 8a, a reflection mirror 8b, a reflection mirror 8c, a relay lens 9a, and a relay lens 9b. The color separation optical system 3 separates the white light LW outputted from the light source device 2 into red light LR, green light LG, and blue light LB. The color separation optical system 3 guides the red light LR to the light modulating device 4R, guides the green light LG to the light modulating device 4G, and guides the blue light LB to the light modulating device 4B.

A field lens 10R is disposed between the color separation optical system 3 and the light modulating device 4R, and causes the incident light to be substantially in parallel to output it toward the light modulating device 4R. A field lens 10G is disposed between the color separation optical system 3 and the light modulating device 4G, and causes the incident light to be substantially in parallel to output it toward the light modulating device 4G. A field lens 10B is disposed between the color separation optical system 3 and the light modulating device 4B, and causes the incident light to be substantially in parallel to output it toward the light modulating device 4B.

The first dichroic mirror 7a allows a red light component to be transmitted and, reflects a green light component and a blue light component. The second dichroic mirror 7b reflects the green light component of the light reflected by the first dichroic mirror 7a, and allows the blue light component to be transmitted. The reflection mirror 8a reflects the red light component that passes through the first dichroic mirror 7a. The reflection mirror 8b and the reflection mirror 8c reflect the blue light component that passes through the second dichroic mirror 7b.

The red light LR that has passed through the first dichroic mirror 7a is reflected by the reflection mirror 8a, and passes through the field lens 10R to enter an image formation region of the light modulating device 4R for red light. The green light LG reflected by the first dichroic mirror 7a is further reflected by the second dichroic mirror 7b, and passes through the field lens 10G to enter an image formation region of the light modulating device 4G for green light. The blue light LB that has passed through the second dichroic mirror 7b passes through the relay lens 9a, the reflection mirror 8b on the incidence side, the relay lens 9b, the reflection mirror 8c on the output side, and the field lens 10B, and enters an image formation region of the light modulating device 4B for blue light.

In accordance with image information, the light modulating device 4R, the light modulating device 4G, and the light modulating device 4B each modulate the corresponding color light inputted thereto and, each form imaging light. The light modulating device 4R, the light modulating device 4G, and the light modulating device 4B are each comprised of a liquid crystal light bulb. Although illustration is not given, a polarizing plate on the incidence side is disposed on the light incidence side of each of the light modulating device 4R, the light modulating device 4G, and the light modulating device 4B. A polarizing plate on the exit side is disposed on a light exit side of each of the light modulating device 4R, the light modulating device 4G, and the light modulating device 4B.

The light synthesizing optical system 5 synthesizes the imaging light outputted from each of the light modulating device 4R, the light modulating device 4G, and the light modulating device 4B to form full-color imaging light. The light synthesizing optical system 5 is comprised of a cross dichroic prism having a substantially square shape in plan view and formed by attaching four right angle prisms together. A dielectric multilayer film is formed at a substantially X-shaped interface where right angle prisms are attached together.

The imaging light outputted from the light synthesizing optical system 5 is expanded and projected by the projection optical device 6, and an image is formed on the screen SCR. In other words, the projection optical device 6 projects the light modulated by the light modulating device 4R, the light modulating device 4G, and the light modulating device 4B. The projection optical device 6 includes a plurality of projection lenses.

The projector 1 according to the present exemplary embodiment includes the light source device 2 according to the exemplary embodiments described above. Thus, it is possible to obtain a bright image with excellent light utilization efficiency.

Note that the technical scope of the present disclosure is not limited to the above-described exemplary embodiment, and various modifications can be made to the above-described exemplary embodiment without departing from the spirit and gist of the present disclosure.

For example, in the exemplary embodiments described above, the plurality of dielectric antennas that constitute the dielectric antenna array is arranged in two dimensional manner. However, instead of this configuration, the wavelength converting element may have a configuration that includes a linear dielectric antenna extending in a predetermined direction, and a plurality of the dielectric antennas is arranged in a one dimensional manner in a direction perpendicular to the direction in which each of the dielectric antennas extends. In other words, as the dielectric antenna group, it may be possible to use a dielectric antenna group that includes a plurality of linear dielectric antennas, and a plurality of slit portions located between adjacent dielectric antennas.

In addition, as for specific description, the shape, the number, the arrangement, the material, or the like of each of the constituent elements of the wavelength converting element, the light source device, and the projector are not limited to the exemplary embodiments described above. It may be possible to make modifications as appropriate. The exemplary embodiments described above give an example in which the light source device according to the present disclosure is mounted on a projector using a liquid crystal light bulb. However, the configuration is not limited to this. The light source device according to the present disclosure may be mounted on a projector using a digital micro-mirror device as a light modulating device.

In addition, the exemplary embodiments described above give an example in which the light source device according to the present disclosure is mounted on a projector. However, the configuration is not limited to this. The light source device according to the present disclosure also can be applied to an illumination appliance, headlight for vehicles, or the like.

What is claimed is:
1. A wavelength converting element, comprising:
a wavelength converting body including an incident surface and an exit surface and configured to perform wavelength conversion on a primary light in a first wavelength band, entered from the incident surface, thereby generating a secondary light in a second wavelength band, which differs from the first wavelength band, the wavelength converting body emitting the secondary light from the exit surface;
a metallic antenna group provided in a close vicinity of the wavelength converting body and including a plurality of metallic antennas disposed so as to be spaced apart from each other at a distance of substantially an optical wavelength of the secondary light in the wavelength converting body; and a dielectric antenna group including a plurality of dielectric antennas and provided so as to face the exit surface of the wavelength converting body.

2. The wavelength converting element according to claim 1, wherein the metallic antenna group has a configuration in which the plurality of metallic antennas are arranged in a lattice manner on a same plane.

3. The wavelength converting element according to claim 1, wherein the dielectric antenna group has a configuration in which the plurality of dielectric antennas are arranged in a lattice manner on a same plane.

4. The wavelength converting element according to claim 1, wherein the metallic antenna group and the dielectric antenna group are provided on a same layer to face the exit surface of the wavelength converting body.

5. The wavelength converting element according to claim 1, further comprising a dielectric layer configured to cover the metallic antenna group, wherein
the dielectric antenna group is provided to face the metallic antenna group across the dielectric layer.

6. The wavelength converting element according to claim 1, further comprising a first dichroic mirror provided to face the incident surface of the wavelength converting body, the first dichroic mirror transmitting the primary light and reflecting the secondary light.

7. The wavelength converting element according to claim 1, further comprising a second dichroic mirror provided to face the exit surface of the wavelength converting body, the second dichroic mirror transmitting the secondary light and reflecting the primary light.

8. The wavelength converting element according to claim 1, further comprising a light reflection layer or a light-absorbing layer provided on a surface, which differs from the incident surface and the exit surface of the wavelength converting body.

9. A light source device comprising:
the wavelength converting element according to claim 1; and
a light source configured to emit the primary light to the wavelength converting element.

10. A display device comprising:
the light source device according to claim 9; and
a light modulating device configured to modulate light from the light source device in accordance with image information.

* * * * *